(12) United States Patent
Kawate et al.

(10) Patent No.: US 9,465,909 B2
(45) Date of Patent: Oct. 11, 2016

(54) SYSTEMS AND METHODS OF DISCRIMINATING DC ARCS AND LOAD SWITCHING NOISE

(71) Applicants: Keith W. Kawate, Attleboro Falls, MA (US); Jianhong Kang, Sharon, MA (US)

(72) Inventors: Keith W. Kawate, Attleboro Falls, MA (US); Jianhong Kang, Sharon, MA (US)

(73) Assignee: Sensata Technologies, Inc., Attleboro, MA (US)

( * ) Notice: Subject to any disclaimer, the term of this patent is extended or adjusted under 35 U.S.C. 154(b) by 980 days.

(21) Appl. No.: 13/679,039

(22) Filed: Nov. 16, 2012

(65) Prior Publication Data

US 2014/0142873 A1 May 22, 2014

(51) Int. Cl.
*G06F 19/00* (2011.01)
*H02H 1/00* (2006.01)
*H02H 3/44* (2006.01)
*G01R 31/40* (2014.01)
*G01R 31/12* (2006.01)
*H02S 50/10* (2014.01)

(52) U.S. Cl.
CPC .......... *G06F 19/00* (2013.01); *G01R 31/1227* (2013.01); *G01R 31/40* (2013.01); *H02H 1/0015* (2013.01); *H02H 3/445* (2013.01); *H02S 50/10* (2014.12)

(58) Field of Classification Search
CPC .............................. G06F 19/00; H02H 1/0015
USPC ............................................................ 702/58
See application file for complete search history.

(56) References Cited

U.S. PATENT DOCUMENTS

| 2001/0040458 | A1* | 11/2001 | Macbeth | H02H 1/0015 324/536 |
| 2006/0050450 | A1* | 3/2006 | Pellon | H02H 1/0015 361/42 |
| 2006/0203401 | A1* | 9/2006 | Kojori | H02H 1/0015 361/42 |
| 2010/0027176 | A1* | 2/2010 | Kawate | H02H 1/0015 361/86 |

FOREIGN PATENT DOCUMENTS

IE   WO 2011151267 A2 * 12/2011  .......... H02H 1/0015

* cited by examiner

*Primary Examiner* — Alexander Satanovsky
*Assistant Examiner* — Lina Cordero
(74) *Attorney, Agent, or Firm* — Chapin Intellectual Property Law, LLC

(57) ABSTRACT

Systems and methods of detecting arcing in DC power systems that can differentiate between DC arcs and load-switching noise. The systems and methods can determine, within a plurality of predetermined time intervals, at least the pulse count (PC) per predetermined time interval, and the pulse duration (PD) per predetermined time interval, in which the PC and the PD can correspond to the number and the intensity of potential arcing events in a DC power system, respectively. The systems and methods can process the PC and PD using one or more arc fault detection algorithms, thereby differentiating between DC arcs and load-switching noise with increased reliability.

23 Claims, 17 Drawing Sheets

SYSTEMS AND METHODS OF DISCRIMINATING DC ARCS AND LOAD SWITCHING NOISE

BACKGROUND

The present application relates generally to detecting arcing in electrical circuits, and more specifically to systems and methods of discriminating between arcing and load-switching noise in direct current (DC) power systems.

In recent years, DC power systems such as photovoltaic (PV) systems have been increasingly employed in home and industrial applications ranging from charging batteries to supplying power to the alternating current (AC) grid. Such PV systems can include a plurality of PV modules (e.g., solar panels) serially connected to form one or more PV strings. Multiple PV strings can be connected in parallel, and routed through a combiner box for ultimately driving a charger or inverter load. In a typical PV system, each PV module can be configured to generate a current output of up to about 10 amps at 50 Vdc, and each PV string can be configured to produce a voltage output of up to about 1000 Vdc or more, depending on the number of PV modules connected on the PV string. Further, the PV strings connected in parallel can be configured to boost the total current output of the typical PV system up to about 200 amps or more.

Because DC power systems such as the PV systems described above can be configured to generate relatively high current and voltage outputs, there is a need for systems and methods of detecting arcing in such power systems. For example, in the typical PV system, in which the current output and the voltage output can be on the order of 200 amps and 1000 Vdc, respectively, series arcing can be produced by disconnecting PV power cables, parallel arcing can be produced by shorting the PV power cables, and ground fault arcing can be produced by shorting the PV power cables to ground. However, known systems and methods of detecting arcing in power systems have heretofore been generally incapable of differentiating between series arcing, parallel arcing, ground fault arcing, etc., and noise generated by charger loads, inverter loads, DC-to-DC load-switching, DC-to-AC load-switching, DC disconnect switches, radio frequency (RF) pickup, DC power line communications, etc., with a high level of reliability.

SUMMARY

In accordance with the present application, systems and methods of detecting arcing in DC power systems are disclosed that can differentiate between DC arcs and load-switching noise with increased reliability. One such system for detecting arcing in DC power systems includes a current sensor, a rectifier, a filter, a comparator, a pulse integrator, and a processor. The current sensor monitors a current output of a DC power system, such as a photovoltaic (PV) system, and provides a signal that contains high frequency AC current information representing one or more significant di/dt events, which may potentially be indicative of one or more arcing events. The rectifier receives the signal containing the AC current information from the current sensor, and provides a rectified version of the signal to the filter for subsequent filtering. It is noted that the signal containing the AC current information may alternatively be filtered before being rectified. The comparator receives the filtered signal, and, in response to the potential arcing events, generates one or more pulses. The pulse integrator receives the pulses from the comparator, and generates an output indicative of the duration of the respective pulses. The processor also receives the pulses from the comparator, and determines, within a plurality of predetermined time intervals, the pulse count (PC) per predetermined time interval, which can correspond to the number of potential arcing events. The processor further receives the output generated by the pulse integrator, and determines, within the respective predetermined time intervals, the pulse duration (PD) per predetermined time interval, which can correspond to the intensity of the respective potential arcing events. The processor then processes the PC and PD, using one or more arc fault detection algorithms, to better differentiate between DC arcs and load-switching noise.

In one aspect, the processor calculates the values of two variables, namely, the average pulse count (APC) and the average pulse duration fluctuation (APDF), at the end of each predetermined time interval. For example, the processor can calculate the pulse duration fluctuation (PDF) at the end of each predetermined time interval by taking the absolute value of the difference between the PD for the most recent time interval, and the PD for the time interval occurring one, two, or more time intervals prior to the most recent time interval, or by any other suitable technique. The processor further determines, at the end of each time interval, whether the ratio, APDF/APC, exceeds a first specified threshold value. In the event the ratio, APDF/APC, exceeds the first specified threshold value at the end of a respective time interval, then that time interval is deemed to be an interval during which an actual arcing event may have occurred. For example, if the processor determines that the ratio, APDF/APC, exceeds the first specified threshold value during the respective time interval, then it can generate an output of "1", or any other suitable output; otherwise, the processor can generate an output of "0", or any other suitable output. The processor averages the outputs (1 or 0) generated over the plurality of time intervals, and, if the average of the respective outputs exceeds a second specified threshold value, then it is assumed that actual arcing has likely occurred, and the processor generates another output indicative of such arcing. In this way, the processor can evaluate the PDF over multiple time intervals, and, if it determines that the PDF over the multiple time intervals is high, then the processor can generate the output indicating that actual arcing has likely occurred.

In another aspect, the processor calculates the values of three variables, namely, the APC, the APDF, and the average pulse duration modulation (APDM), at the end of each predetermined time interval. For example, the processor can calculate the APDM by taking four PD measurements, PD1, PD2, PD3, PD4, during each predetermined time interval, spaced one quarter of the time interval apart, and calculating the APDM at the end of each time interval, as follows,

APDM=|APD1+APD2−APD3−APD4|+|APD1−APD2−APD3+APD4|, in which "APD1" is the average of the "PD1" measurements, "APD2" is the average of the "PD2" measurements, "APD3" is the average of the "PD3" measurements, and "APD4" is the average of the "PD4" measurements, over the plurality of predetermined time intervals, or by any other suitable technique. The processor further determines, at the end of each time interval, whether the ratio, APDF/APC, exceeds a first specified threshold value, and whether the ratio, APDF/APDM, exceeds a second specified threshold. In the event it is determined that, at the end of a respective time interval, the ratio, APDF/APC, exceeds the first specified threshold value, and the ratio, APDF/APDM, exceeds the second specified threshold, then that time interval is deemed to be an interval during which an actual arcing event may have occurred. For example, if the processor determines that the ratio, APDF/APC, exceeds the first specified threshold value and the ratio, APDF/APDM, exceeds the second specified threshold value during the respective time interval, then it can generate an output of "1", or any other suitable output; otherwise, the processor can generate an output of "0", or any other suitable output. The processor averages the outputs (1 or 0) generated over the plurality of time intervals, and, if the average of the respective outputs exceeds a third specified threshold value, then it is assumed that actual arcing has likely occurred, and the processor generates another output indicative of such arcing. In this way, the processor can more reliably distinguish between actual arcing and very noisy loads, such as grid-tied inverter loads.

In a further aspect, the processor calculates the values of five variables, namely, the APC, the APDF, the APDM, the average pulse duration (APD), and the average pulse count fluctuation (APCF), at the end of each predetermined time interval. For example, the processor can calculate the APCF by taking the absolute value of the difference between the PC for the most recent time interval, and the PC for the time interval occurring one, two, or more intervals prior to the most recent time interval, or by any other suitable technique. The processor further determines, at the end of each time interval, whether the ratio, APDF/APC, exceeds a first specified threshold value, whether the ratio, APDF/APDM, exceeds a second specified threshold, whether the ratio, APCF/APC, exceeds a third specified threshold, whether the ratio, APDF/APD, exceeds a fourth specified threshold, whether APC exceeds a fifth specified threshold, and whether APD exceeds a sixth specified threshold. In the event it is determined that, at the end of a respective time interval, the ratio, APDF/APC, exceeds the first specified threshold value, the ratio, APDF/APDM, exceeds the second specified threshold, the ratio, APCF/APC, exceeds the third specified threshold, the ratio, APDF/APD, exceeds the fourth specified threshold, APC exceeds the fifth specified threshold, and APD exceeds the sixth specified threshold, then that time interval is deemed to be an interval during which an actual arcing event may have occurred. The processor can therefore generate an output of "1", or any other suitable output; otherwise, the processor can generate an output of "0", or any other suitable output. The processor averages the outputs (1 or 0) generated over the plurality of time intervals, and, if the average of the respective outputs exceeds a seventh specified threshold value, then it is assumed that actual arcing has occurred, and the processor generates another output indicative of such arcing. In this way, it can be assured that, in the DC power system, there exists some minimal level of normalized average fluctuation that is indicative of arcing versus load noise.

By determining, within a plurality of predetermined time intervals, at least the pulse count (PC) per predetermined time interval, and the pulse duration (PD) per predetermined time interval, in which the PC and the PD can correspond to the number and the intensity of potential arcing events in a DC power system, respectively, and then processing the PC and the PD using one or more arc fault detection algorithms, the disclosed systems and methods of detecting arcing in DC power systems can differentiate between DC arcs and load-switching noise with increased reliability.

Other features, functions, and aspects of the invention will be evident from the Detailed Description that follows.

BRIEF DESCRIPTION OF THE DRAWINGS

The accompanying drawings, which are incorporated in and constitute a part of this specification, illustrate one or more embodiments described herein and, together with the Detailed Description, explain these embodiments. In the drawings.

DETAILED DESCRIPTION

Figure 1A:
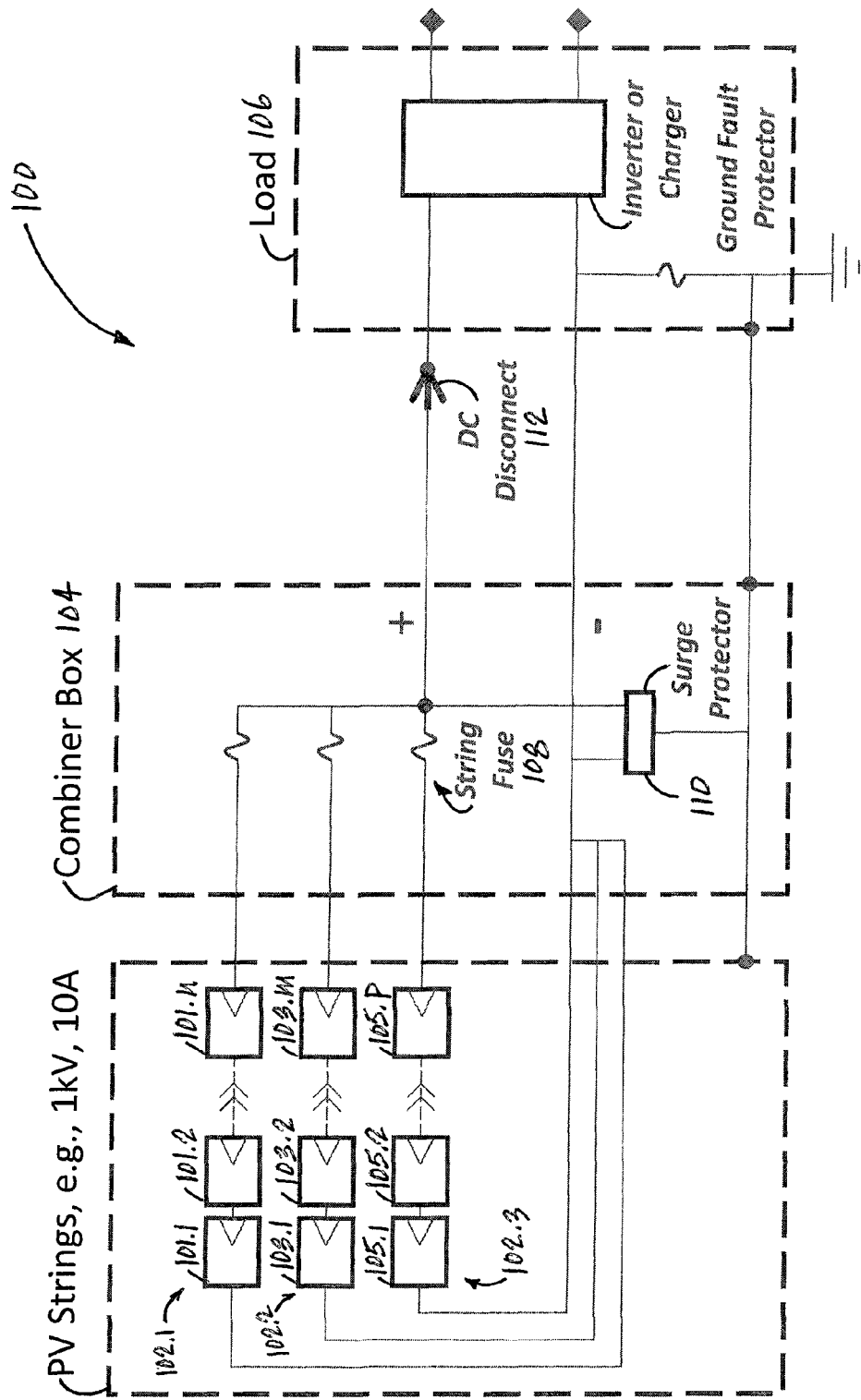
FIG. 1a illustrates a block diagram of a typical photovoltaic (PV) system.

FIG. 1a depicts a typical DC power system, specifically, a photovoltaic (PV) system 100. Such PV systems have been increasingly employed in home and industrial applications ranging from charging batteries to supplying power to the AC grid. The PV system 100 includes a plurality of PV modules (e.g., solar panels) 101.1-101.n, 103.1-103.m, 105.1-105.p, a combiner box 104, and a load 106. As shown in FIG. 1a, the PV modules 101.1-101.n are serially connected to form a first PV string 102.1, the PV modules 103.1-103.n are serially connected to form a second PV string 102.2, and the PV modules 105.1-105.n are serially connected to form a third PV string 102.3. Further, the first, second, and third PV strings 102.1, 102.2, 102.3 can be connected in parallel, and can be routed through the combiner box 104 for ultimately driving the load 106, which can be a charger load, an inverter load, or any other suitable load. As further shown in FIG. 1a, the combiner box 104 can include a string fuse 108 for each PV string, and a surge protector 110. The PV system 100 can also include a DC disconnect switch 112. It is noted that the PV system 100 may alternatively be configured to include any other suitable number of PV modules serially connected to form any other suitable number of PV strings.

Figure 1B:
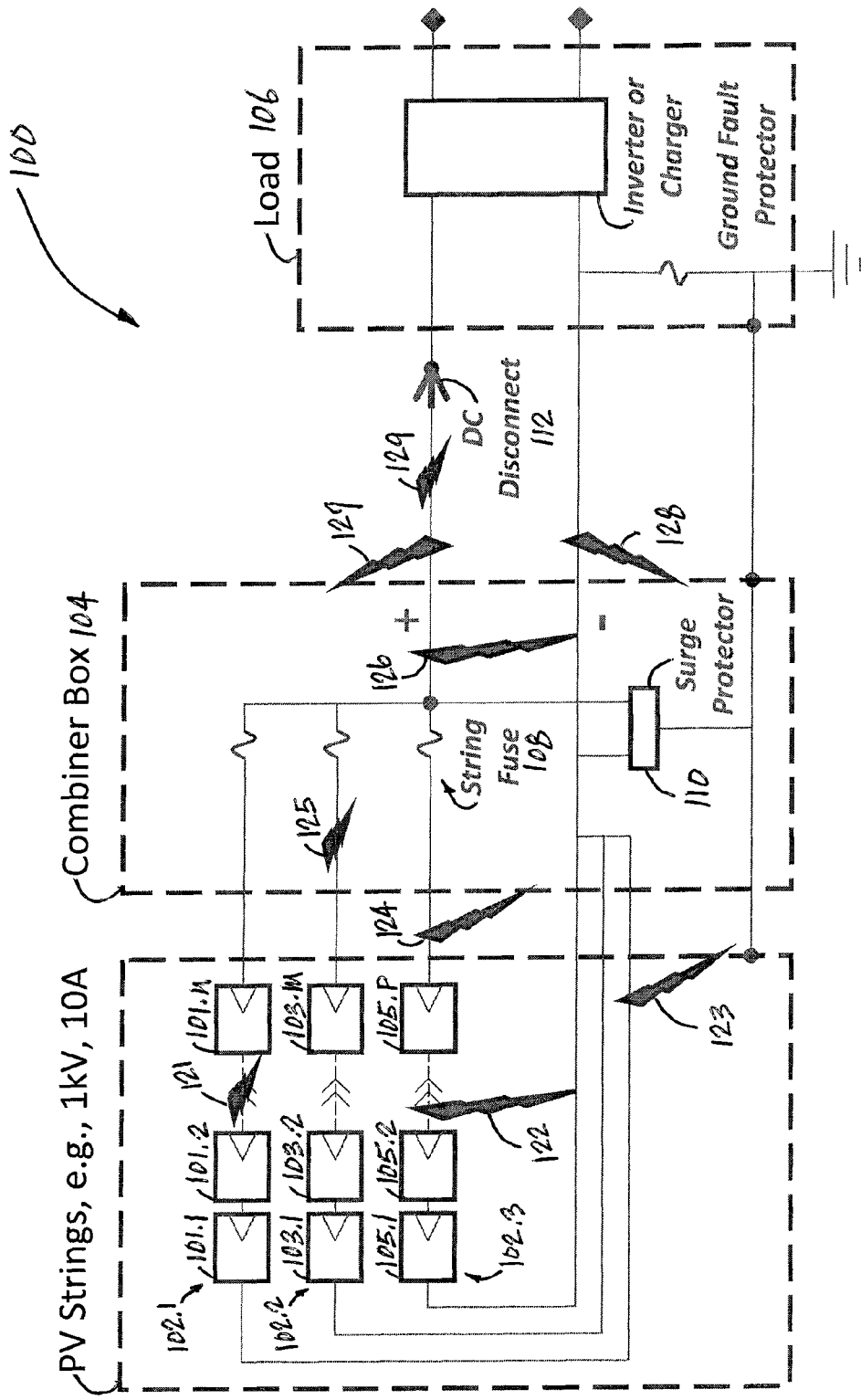
FIG. 1b illustrates the PV system of FIG. 1a, further indicating possible locations of various types of arcing.
Figure 1C:
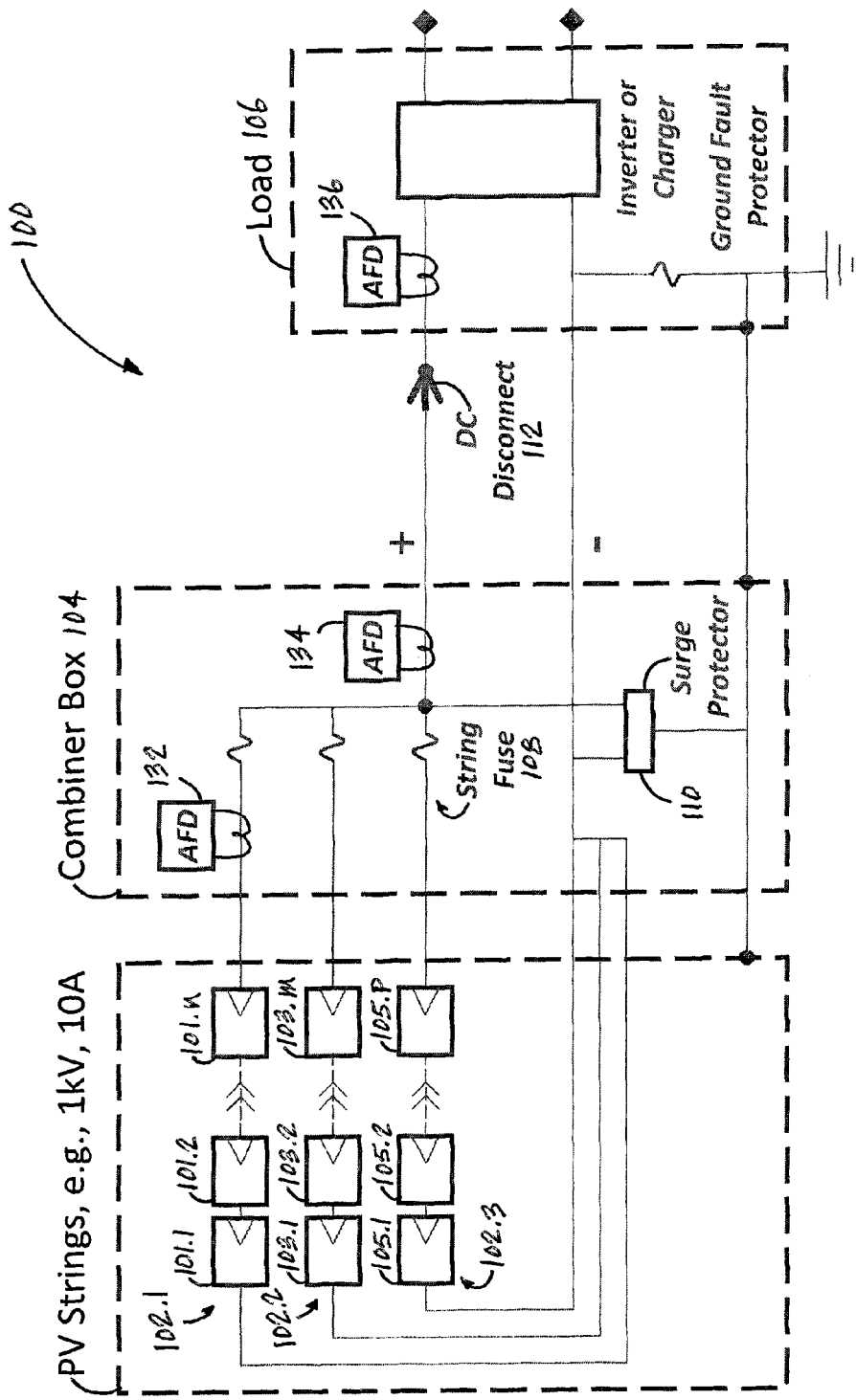
FIG. 1c illustrates the PV system of FIG. 1a, further indicating possible sites of arc fault detectors for detecting the various types of arcing indicated in FIG. 1b.

FIG. 1b depicts a number of exemplary locations 121-129 within the PV system 100 where arcing may potentially occur. For example, series arcing may potentially occur at the locations 121, 125, 129, parallel arcing may potentially occur at the locations 122, 126, and ground fault arcing may potentially occur at the locations 123, 124, 127, 128. Moreover, FIG. 1c depicts several exemplary sites within the PV system 100 where arc fault detectors (AFD) 132, 134, 136 may be situated to detect such potential arcing. For example, the AFDs 132, 134 may be situated within the combiner box 104 where the PV strings are combined, and the AFD 136 may be situated in proximity to the load 106. It is noted that any other suitable number of AFDs may be employed to detect arcing at any other suitable sites within the PV system 100.

Figure 2:
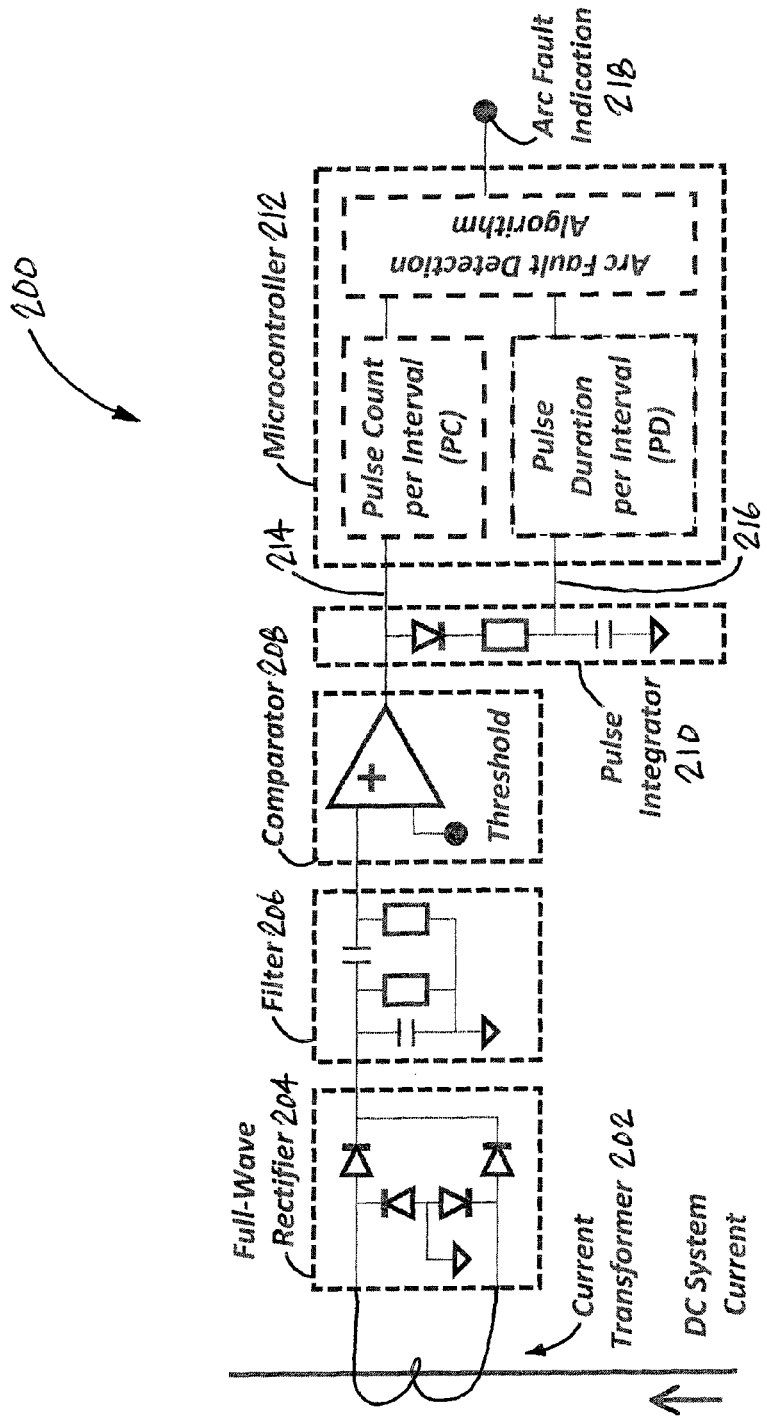
FIG. 2 illustrates a block diagram of an exemplary system for detecting arcing in DC power systems, in accordance with the present application.

FIG. 2 depicts an exemplary system 200 for detecting arcing in DC power systems, in accordance with the present application. For example, the system 200 may be implemented within one or more AFDs, such as the AFDs 132, 134, 136 within the PV system 100, to differentiate between DC arcs and load-switching noise with increased reliability. As shown in FIG. 2, the system 200 includes a current sensor 202, a rectifier 204, a filter 206, a comparator 208, a pulse integrator 210, and a processor 212. The current sensor 202 can be implemented as a current transformer for monitoring a current output of the DC power system. For example, the current sensor 202 implemented as a current transformer can be connected in series with either the positive (+) DC power line or the negative (−) DC power line. The current sensor 202 provides a signal that contains high frequency AC current information representing one or more significant di/dt events, which may be indicative of one or more potential arcing events. The rectifier 204, which can be implemented as a full-wave rectifier, receives the signal containing the AC current information from the current sensor 202, and provides a full-wave rectified version of the signal to the filter 206 for subsequent high-pass filtering.

The comparator 208 receives the filtered signal, and, in response to the potential arcing events, generates one or more pulses on a line 214. The pulse integrator 210 receives the pulses from the comparator 208, and generates an output indicative of the duration of the respective pulses on a line 216. The processor 212, which can be implemented as a microcontroller, also receives the pulses from the comparator on the line 214. The processor 212 determines, within a plurality of predetermined time intervals, the pulse count (PC) per time interval, which can correspond to the number of potential arcing events. The processor 212 further receives the output generated by the pulse integrator 210 on the line 216, and determines, within the respective predetermined time intervals, the pulse duration (PD) per time interval, which can correspond to the intensity of the respective potential arcing events. Using one or more arc fault detection algorithms, as further described herein, the processor 212 then processes at least the PC and PD to better differentiate between DC arcs and load-switching noise, and generates, at least at some times, an arc fault indication 218 as an output.

Figure 3A:
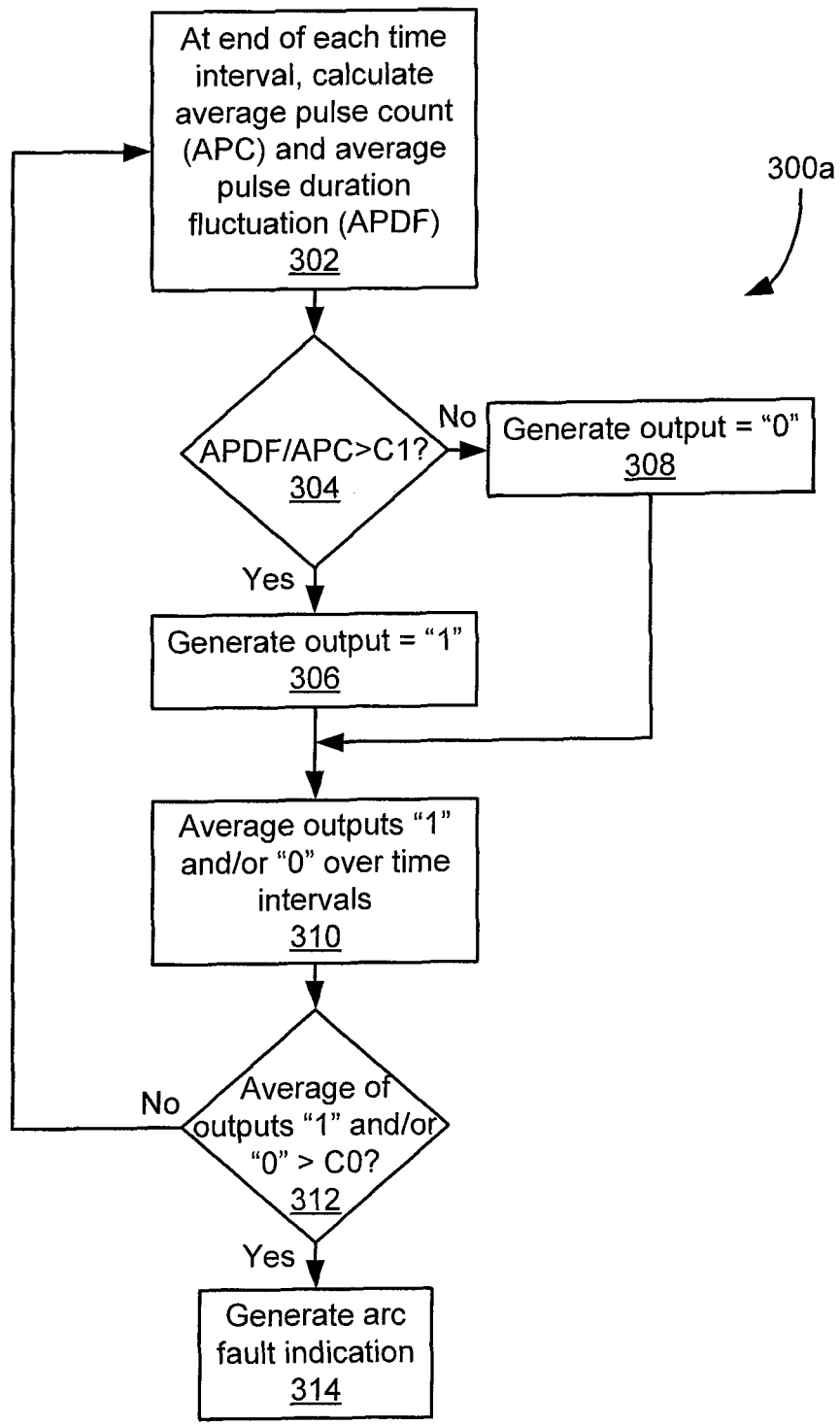
FIG. 3a illustrates a flow diagram of a first exemplary method of detecting arcing in DC power systems, using the system of FIG. 2.

A first exemplary method 300a of detecting arcing in DC power systems is described below with reference to FIG. 3a, as well as FIG. 2. Using the method 300a, the system 200 can evaluate the fluctuation of the PD over multiple predetermined time intervals, and, if it determines that the fluctuation of the PD over the respective time intervals is high, then the system 200 can generate the arc fault indication 218, thereby indicating that actual arcing has likely occurred. For example, each predetermined time interval may be equal to any suitable time interval. In some embodiments, the predetermined time interval can be equal to about one-half of the AC grid cycle period in order to minimize electromagnetic coupling to AC power lines, as well as reduce the switching noise generated by grid-tied inverter loads. As depicted in step 302, the processor 212 calculates the values of two variables, namely, the average pulse count (APC) and the average pulse duration fluctuation (APDF), at the end of each time interval. For example, such averaging may be accomplished using a first-order, low-pass filter to retain the variable values without requiring excessive memory. It is noted that, because so-called sputtering arcs can be fewer in number but more intense than continuous arcing, such averaging allows sputtering arcs, as well as more continuous arcing, to be better discriminated from other noise sources. The time constant of such averaging can range from about 20 msecs to 200 msecs, or any other suitable range of time values.

The processor 212 can calculate the pulse duration fluctuation (PDF) at the end of each predetermined time interval by taking the absolute value of the difference between the PD for the most recent time interval, and the PD for the time interval occurring one, two, or more time intervals prior to the most recent time interval, or by any other suitable technique. As depicted in step 304, the processor 212 determines, at the end of each time interval, whether the ratio, APDF/APC, exceeds a first specified threshold value, C1. In the event the ratio, APDF/APC, exceeds the first specified threshold value, C1, at the end of a respective time interval, then that time interval is deemed to be an interval during which an actual arcing event may have occurred. For example, if the processor 212 determines that the ratio, APDF/APC, exceeds the first specified threshold value, C1, during the respective time interval, then it can generate an output of "1", or any other suitable output, as depicted in step 306. Otherwise, the processor 212 can generate an output of "0", or any other suitable output, as depicted in step 308. As depicted in step 310, the processor 212 averages the outputs (1 and/or 0) generated over the plurality of predetermined time intervals. For example, such averaging can be performed using a low-pass filter, a running sum, or an event counter, over multiple time intervals, or using any other suitable technique. Further, the time constant of this averaging may be in the range of 0.1 secs to 1.0 sec to allow any possible arc fault indications to occur within a reasonable time. As depicted in step 312, the processor 212 then determines whether the average of the respective outputs exceeds a specified threshold output value, C0. If the average of the respective outputs exceeds the specified threshold output value, C0, then it is assumed that actual arcing has occurred, and the processor 212 generates the arc fault indication 218, as depicted in step 314. Otherwise, the method 300a loops back to step 302.

Figure 3B:
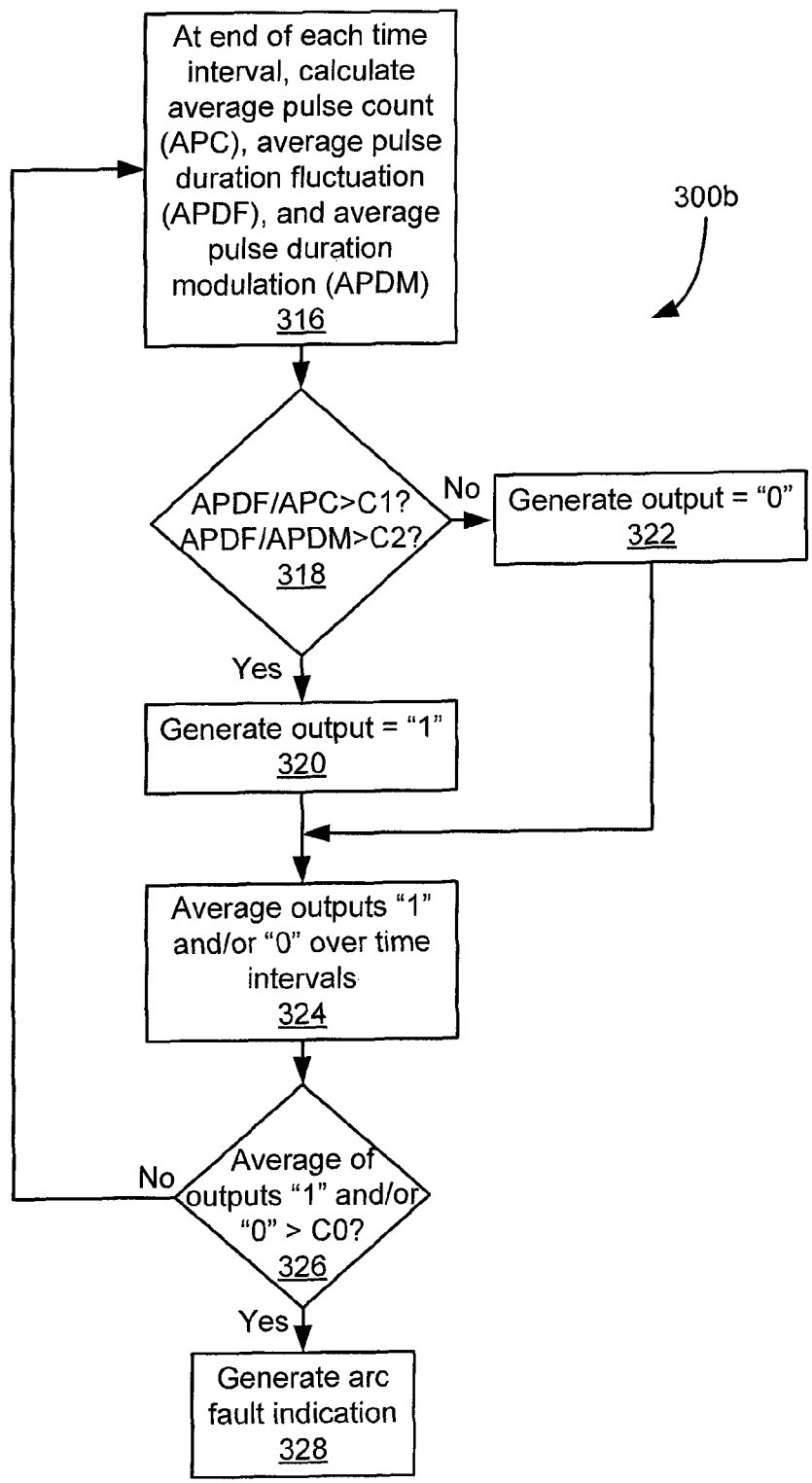
FIG. 3b illustrates a flow diagram of a second exemplary method of detecting arcing in DC power systems, using the system of FIG. 2.

A second exemplary method 300b of detecting arcing in DC power systems is described below with reference to FIG. 3b, as well as FIG. 2. Using the method 300b, the system 200 can more reliably distinguish between actual arcing and very noisy loads, such as grid-tied inverter loads. As depicted in step 316, the processor 212 calculates the values of three variables, namely, the APC, the APDF, and the average pulse duration modulation (APDM), at the end of each predetermined time interval. For example, the processor 212 can calculate the APDM by taking four PD measurements, PD1, PD2, PD3, PD4, during each time interval, spaced one quarter of the time interval apart, and calculating the APDM at the end of each time interval, as follows, $$APDM = |APD1 + APD2 - APD3 - APD4| + |APD1 - APD2 - APD3 + APD4|, \quad (1)$$

in which "APD1" is the average of the respective "PD1" measurements, "APD2" is the average of the respective "PD2" measurements, "APD3" is the average of the respective "PD3" measurements, and "APD4" is the average of the respective "PD4" measurements, over the plurality of time intervals, or by any other suitable technique. For example, such averaging of each quarter-interval measurement can be performed using a low-pass filter over multiple time intervals. Further, each time interval can be at or near one-half of the AC grid cycle period, e.g., 1/(2*55 Hz) for 60 Hz or 50 Hz AC grids. As depicted in step 318, the processor 212 determines, at the end of each time interval, whether the ratio, APDF/APC, exceeds a first specified threshold value, C1, and whether the ratio, APDF/APDM, exceeds a second specified threshold, C2. In the event it is determined that, at the end of a respective time interval, the ratio, APDF/APC, exceeds the first specified threshold value, C1, and the ratio, APDF/APDM, exceeds the second specified threshold, C2, then that time interval is deemed to be an interval during which an actual arcing event may have occurred. For example, if the processor 212 determines that the ratio, APDF/APC, exceeds the first specified threshold value, C1, and the ratio, APDF/APDM, exceeds the second specified threshold value, C2, during the respective time interval, then it can generate an output of "1", or any other suitable output, as depicted in step 320. Otherwise, the processor 212 can generate an output of "0", or any other suitable output, as depicted in step 322. As depicted in step 324, the processor 212 averages the outputs (1 and/or 0) generated over the plurality of time intervals. As depicted in step 326, the processor 212 then determines whether the average of the respective outputs exceeds a specified threshold output value, C0. If the average of the respective outputs exceeds the specified threshold output value, C0, then it is assumed that actual arcing has occurred, and the processor 212 generates the arc fault indication 218, as depicted in step 328. Otherwise, the method 300b loops back to step 316.

Figure 3C:
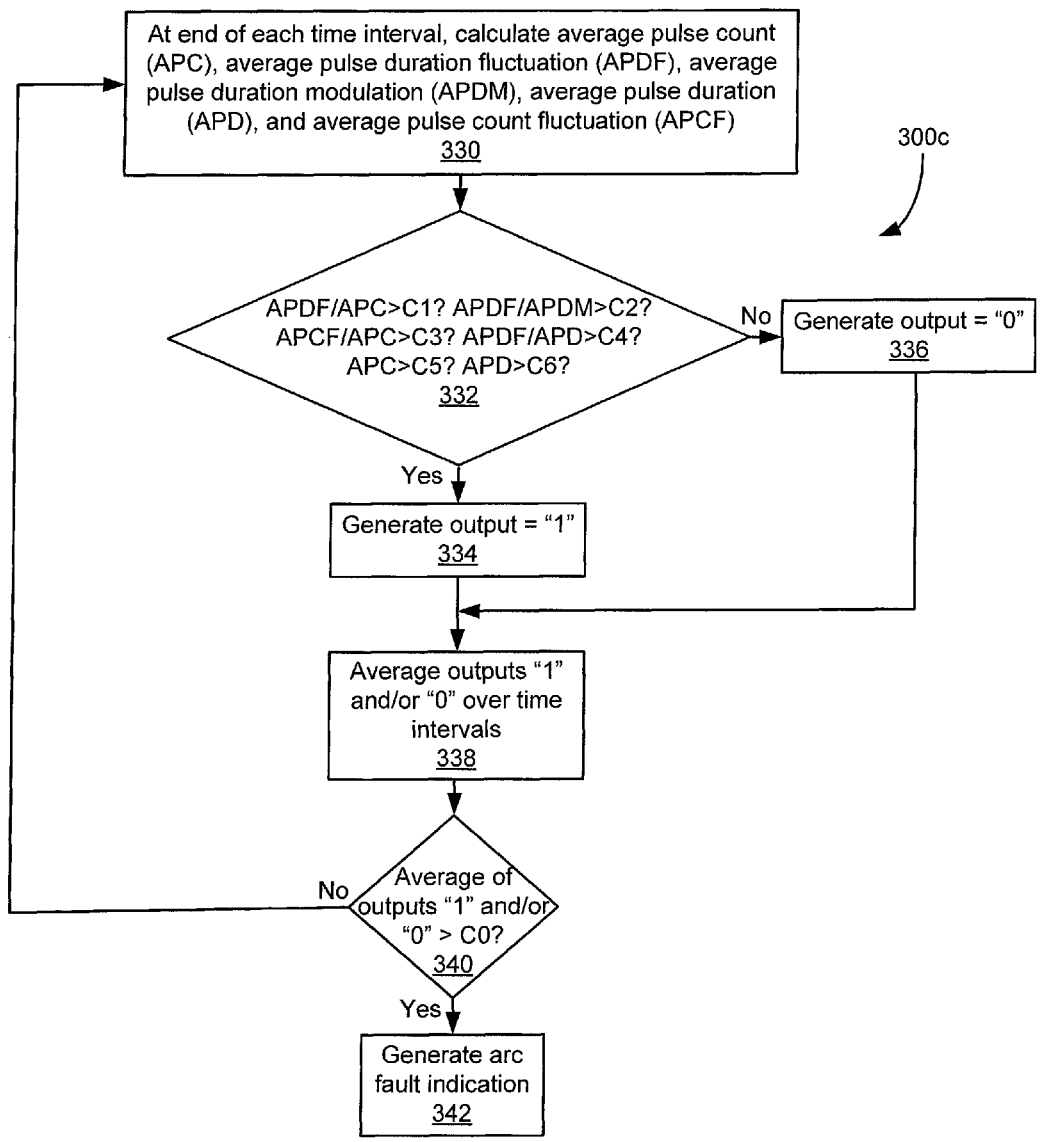
FIG. 3c illustrates a flow diagram of a third exemplary method of detecting arcing in DC power systems, using the system of FIG. 2.

A third exemplary method 300c of detecting arcing in DC power systems is described below with reference to FIG. 3c, as well as FIG. 2. The method 300c provides a way of assuring that, in a DC power system, there exists some minimal level of normalized average fluctuation that is indicative of arcing versus load noise. As depicted in step 330, the processor 212 calculates the values of five variables, namely, the APC, the APDF, the APDM, the average pulse duration (APD), and the average pulse count fluctuation (APCF), at the end of each predetermined time interval. For example, the processor 212 can calculate the APCF by taking the absolute value of the difference between the PC for the most recent time interval, and the PC for the time interval occurring one or two intervals prior to the most recent time interval, or by any other suitable technique. As depicted in step 332, the processor 212 determines, at the end of each time interval, whether the ratio, APDF/APC, exceeds a first specified threshold value, C1, whether the ratio, APDF/APDM, exceeds a second specified threshold value, C2, whether the ratio, APCF/APC, exceeds a third specified threshold value C3, whether the ratio, APDF/APD, exceeds a fourth specified threshold value, C4, whether APC exceeds a fifth specified threshold value, C5, and whether APD exceeds a sixth specified threshold value, C6. In the event it is determined that, at the end of a respective time interval, the ratio, APDF/APC, exceeds the first specified threshold value, C1, the ratio, APDF/APDM, exceeds the second specified threshold value, C2, the ratio, APCF/APC, exceeds the third specified threshold value, C3, the ratio, APDF/APD, exceeds the fourth specified threshold value, C4, APC exceeds the fifth specified threshold value, C5, and APD exceeds the sixth specified threshold value, C6, then that time interval is deemed to be an interval during which an actual arcing event may have occurred. The processor 212 therefore generates an output of "1", or any other suitable output, as depicted in step 334. Otherwise, the processor 212 generates an output of "0", or any other suitable output, as depicted in step 336. As depicted in step 338, the processor 212 averages the outputs (1 and/or 0) generated over the plurality of time intervals. As depicted in step 340, the processor 212 then determines whether the average of the respective outputs exceeds a specified threshold output value, C0. If the average of the respective outputs exceeds the specified threshold output value, C0, then it is assumed that actual arcing has occurred, and the processor 212 generates the arc fault indication 218, as depicted in step 342. Otherwise, the method 300c loops back to step 330.

Figure 4A:
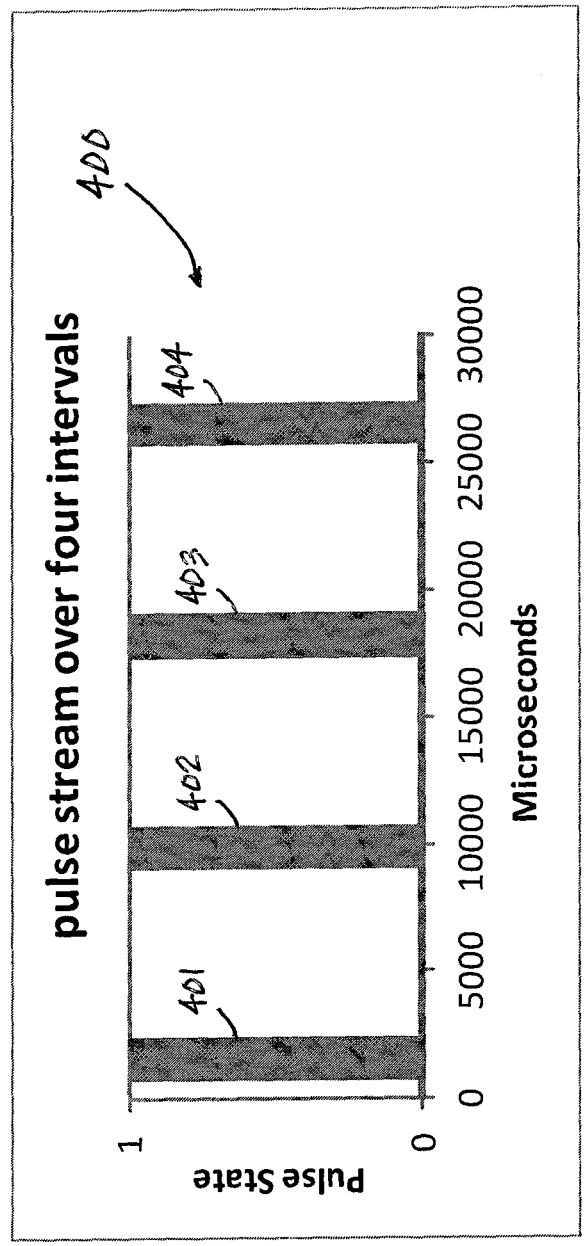
FIGS. 4a-4d illustrate diagrams of exemplary pulse stream data that can be generated during startup of an inverter load, and during arcing in the presence of continuous inverter noise, using the system of FIG. 2.
Figure 4B:
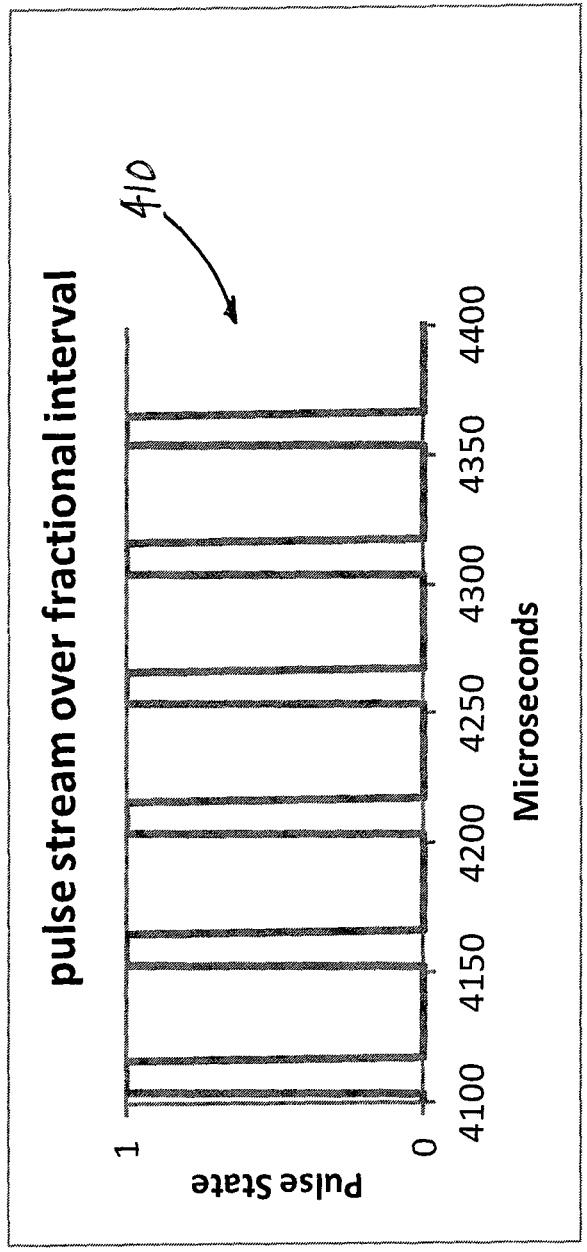

The disclosed systems and methods of detecting arcing in DC power systems are further described below with reference to the following illustrative examples, and FIGS. 1, 2, 3a, 3b, 4a-4d, 5a-5c, and 6a-6c. In a first example, it is demonstrated that series arcing can be a cause of both pulse duration fluctuation (PDF) and pulse duration modulation (PDM) in a DC power system. FIG. 4a illustrates an exemplary pulse stream 400 generated by the comparator 208 on the line 214 during startup of the load 106, which can be an inverter load. In this first example, such an inverter load can be tied to the AC grid, which can have a frequency equal to about 60 Hz. As shown in FIG. 4a, the pulse stream 400 includes a series of pulse bursts 401, 402, 403, 404, which generally represent load-switching noise produced during startup of the inverter load. Each pulse burst 401, 402, 403, 404 occurs within a predetermined time interval of 1/(2*60 Hz), or about 8,333 μsecs. FIG. 4b illustrates a series of exemplary pulses 410, which may be included in one of the pulse bursts 401, 402, 403, 404. As shown in FIG. 4b, both the periods and the durations of the respective pulses 410 are generally uniform.

Figure 4C:
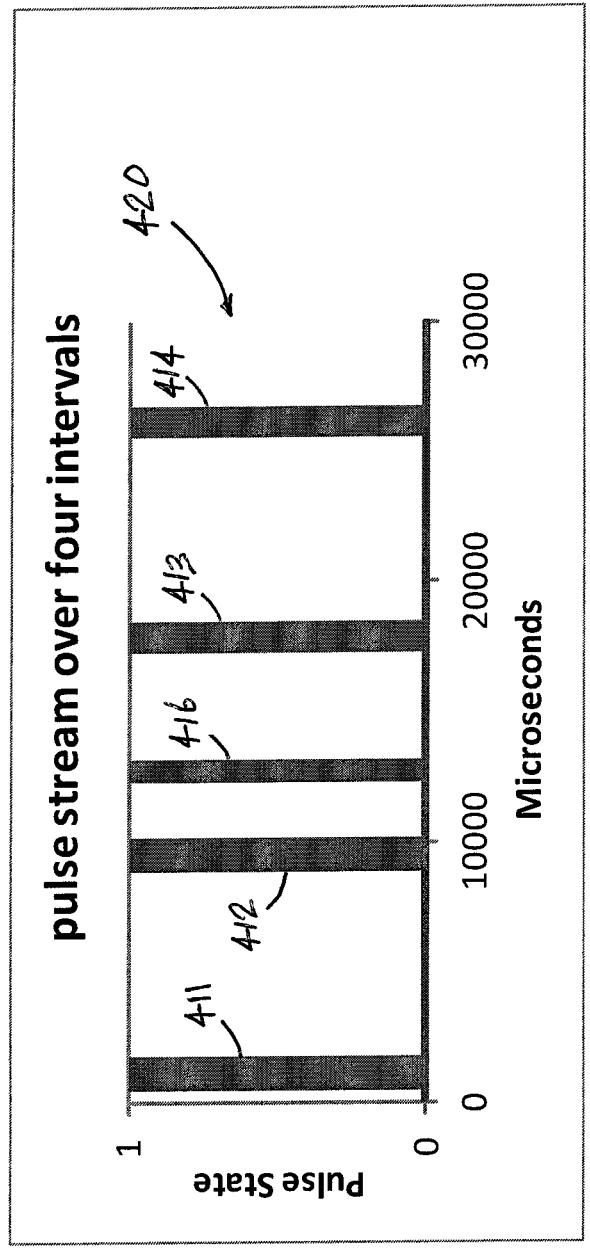

FIG. 4c illustrates an exemplary pulse stream 420 generated by the comparator 208 on the line 214 during series arcing in the presence of continuous inverter load noise. As shown in FIG. 4c, the pulse stream 420 includes a series of pulse bursts 411, 412, 413, 414, each occurring within the predetermined time interval of about 8,333 μsecs. As further shown in FIG. 4c, the series arcing has caused an extra pulse burst 416 to be introduced between the pulse bursts 412, 413. It is noted that the extra pulse burst 416 caused by the series arcing is not in synchronization with the periodic pulse bursts 411, 412, 413, 414 resulting from the load-switching noise. Because the series arcing has introduced the extra pulse burst 416 between the pulse bursts 412, 413, such series arcing has caused some PDF per time interval within the pulse stream 420.

Figure 4D:
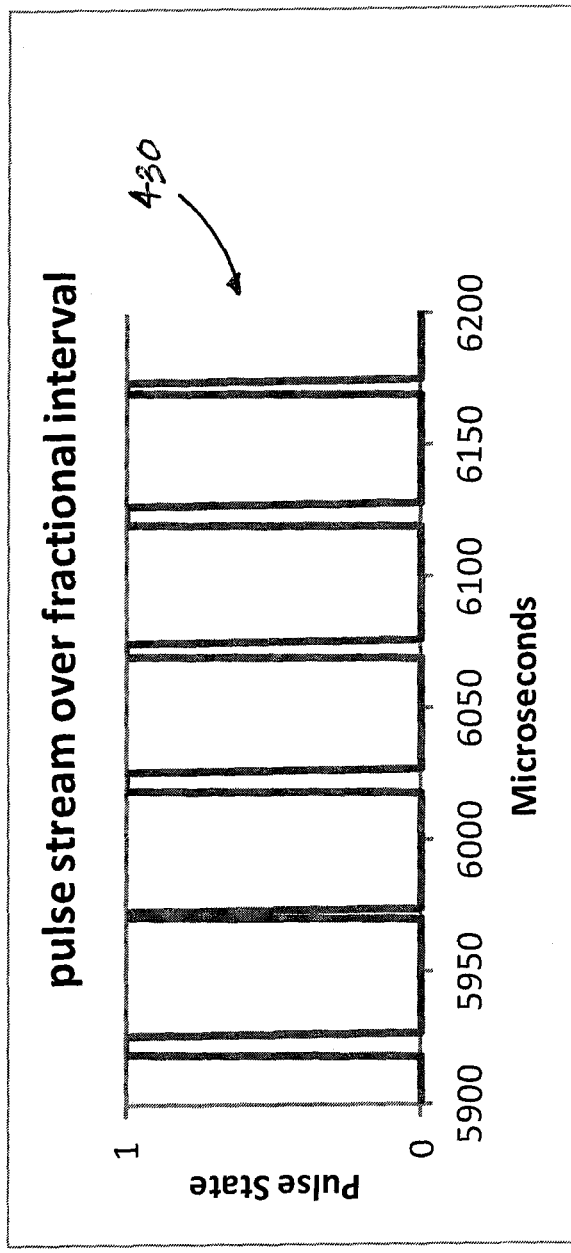

FIG. 4d illustrates a series of exemplary pulses 430 that may be included in one of the pulse bursts 411, 412, 413, 414. By comparing the series of pulses 430 generated during series arcing with the series of pulses 410 generated during startup of the inverter load, it can be observed that the series arcing has also caused some PDM within the series of pulses 430. It is noted that the widths of the respective pulses 430 are generally narrower than the widths of the pulses 410, thereby indicating that the pulses 410 produced during startup of the inverter load can be more intense than the pulses 430 produced during series arcing in the presence of continuous inverter load noise. Nonetheless, it can be observed that the general randomness of arcing can produce greater PDF and/or PDM than the more uniform load-switching noise.

Figure 5A:
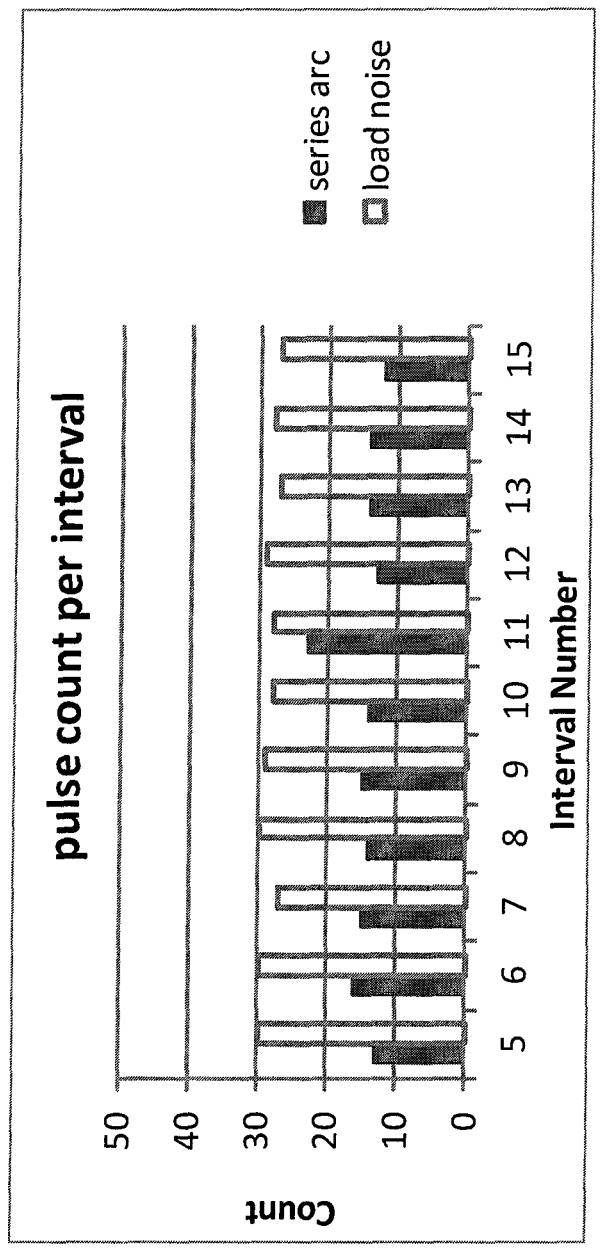
FIGS. 5a-5c illustrate diagrams of exemplary variables that can be measured and calculated as a function of a number of time intervals, using the system of FIG. 2.
Figure 5B:
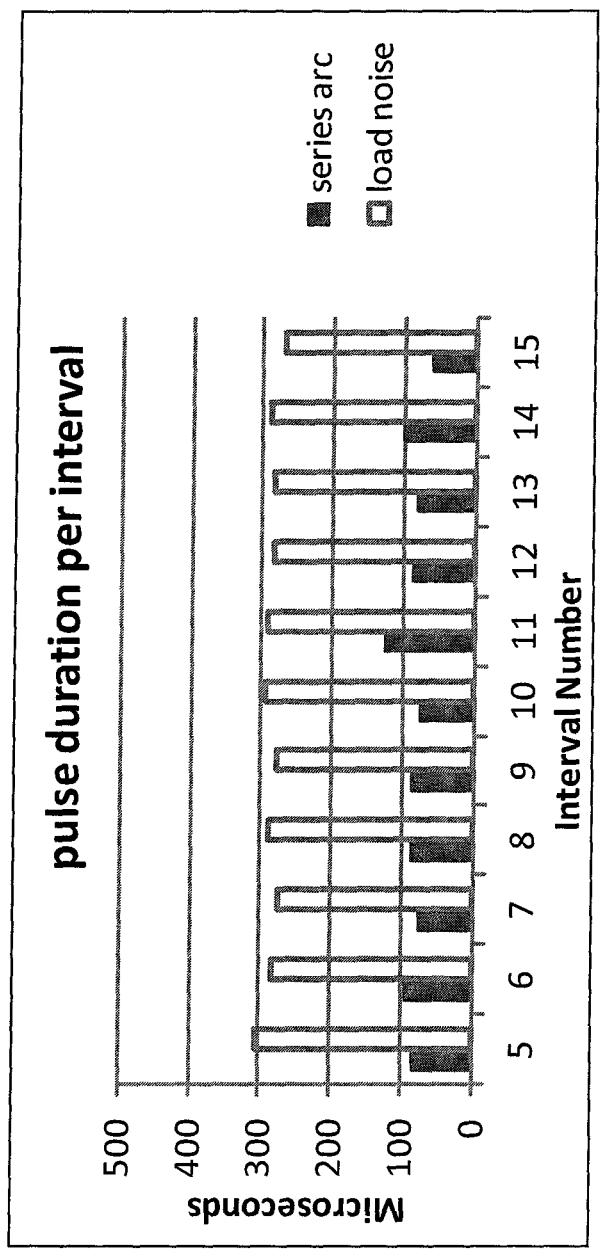

In a second example, it is demonstrated that both the pulse count (PC) per time interval, and the pulse duration (PD) per time interval, can be greater during startup of an inverter load than during series arcing in the presence of continuous inverter noise, and therefore an analysis of the measured PC and/or PD per time interval alone may be insufficient to reliably discriminate between DC arcs and load-switching noise. FIG. 5a illustrates pulse counts measured by the processor 212 for a plurality of exemplary time intervals numbered 5 through 15. As shown in FIG. 5a, the measured PC per time interval during startup of the inverter load is generally within the range of about 20 to 30 counts, whereas the measured PC per time interval during series arcing is generally within the range of about 10 to 20 counts, with the exception of time interval 11, in which the measured PC during series arcing is between 20 counts and 30 counts. FIG. 5b illustrates pulse durations measured by the processor 212 for the exemplary time intervals numbered 5 through 15. As shown in FIG. 5b, the measured PD per time interval during startup of the inverter load is generally within the range of about 200 to 300 μsecs, whereas the measured PD per time interval during series arcing is generally within the range of about 0 to 100 μsecs, with the exception of time interval 11, in which the measured PD during series arcing is between 100 μsecs and 200 μsecs.

Figure 5C:
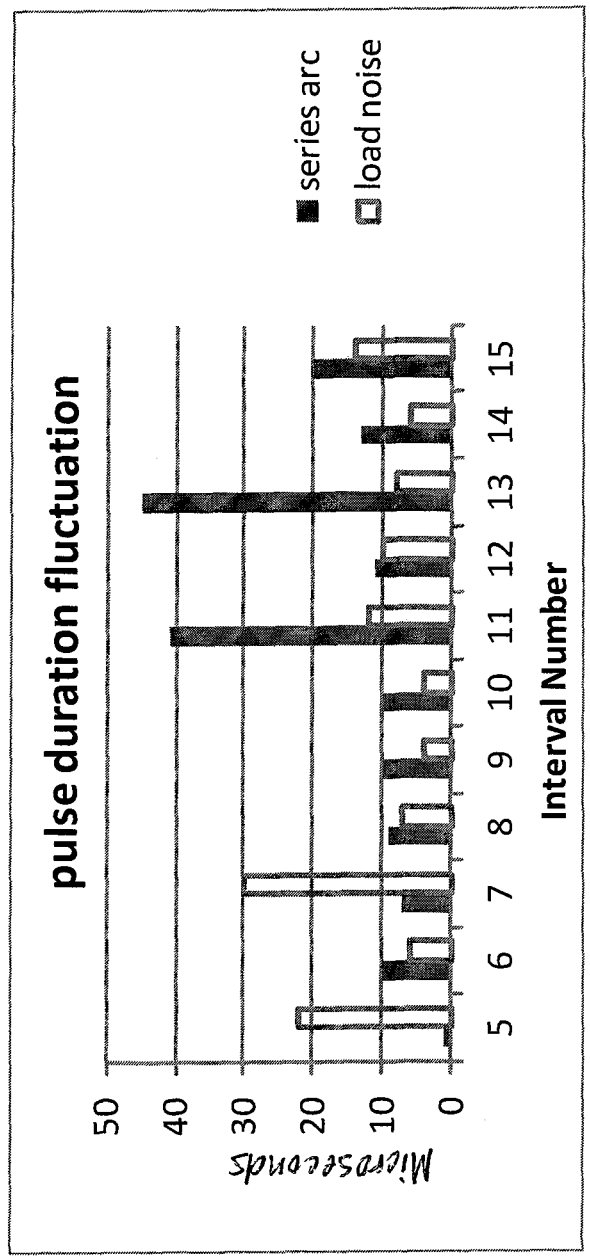

FIG. 5c illustrates the pulse duration fluctuation (PDF) calculated by the processor 212 for the exemplary time intervals numbered 5 through 15. As described herein with respect to the first exemplary method 300a, the processor 212 can calculate the PDF at the end of each predetermined time interval by taking the absolute value of the difference between the PD for the most recent time interval, and the PD for the time interval occurring one, two, or more time intervals prior to the most recent time interval. As shown in FIG. 5c, the calculated PDF during startup of the inverter load is generally within the range of 0 to 10 μsecs, with the exceptions of time intervals 5, 7, 11, and 15, in which the calculated PDF is just over 20 μsecs, about 30 μsecs, just over about 10 μsecs, and between 10 μsecs and 20 μsecs, respectively. As further shown in FIG. 5c, the calculated PDF during series arcing is also generally within the range of 0 to 10 μsecs, with the exceptions of time intervals 11, 13, 14, and 15, in which the calculated PDF is just over about 40 μsecs, between 40 μsecs and 50 μsecs, between 10 μsecs and 20 μsecs, and about 20 μsecs, respectively. Accordingly, based on the calculated PDFs illustrated in FIG. 5c, an analysis of the calculated PDF per time interval alone may also be insufficient to reliably discriminate between DC arcs and load-switching noise.

Figure 6A:
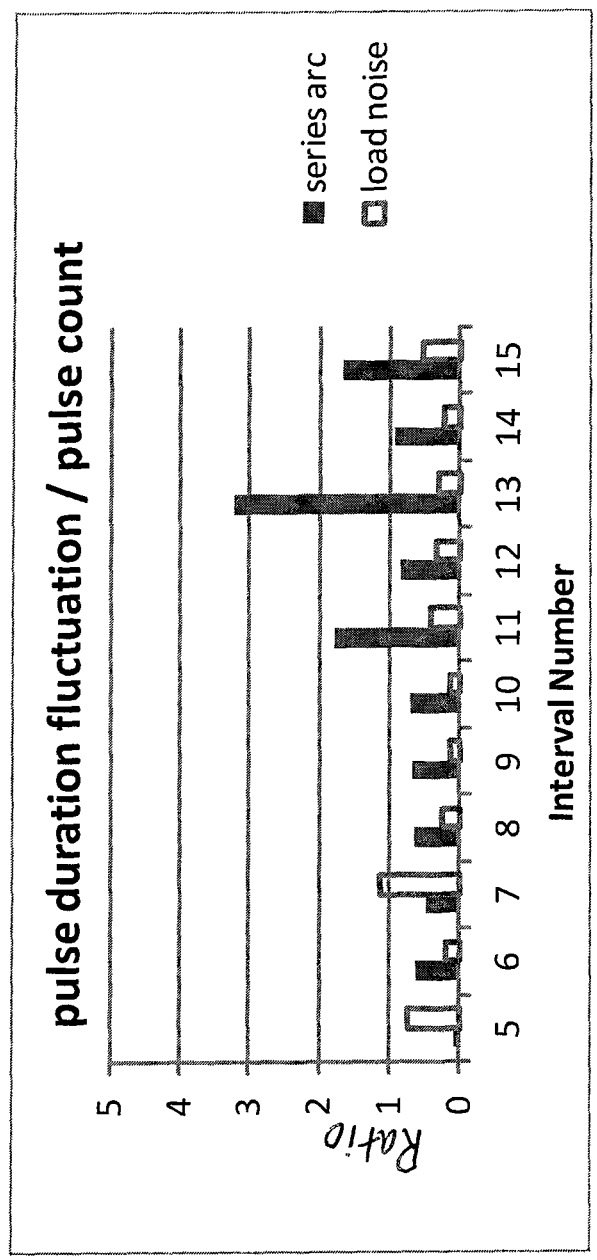
FIGS. 6a-6c illustrate diagrams of exemplary techniques for discriminating DC arcs from load-switching noise, using the system of FIG. 2.

In a third example, it is demonstrated that an analysis of at least the ratio, PDF/PC, at the end of each time interval, would be sufficient to reliably discriminate between DC arcs and load-switching noise. FIG. 6a illustrates the ratio, PDF/PC, at the end of each exemplary time interval numbered 5 through 15, as determined by the processor 212. As shown in FIG. 6a, the ratio, PDF/PC, determined during series arcing is generally significantly greater than the corresponding ratio, PDF/PC, determined during startup of the inverter load (see, e.g., the respective ratios, PDF/PC, for time intervals 6, and 8 through 15). It is noted that, if the ratio, APDF/APC, were determined at the end of each numbered time interval (as described herein with reference to step 304 of the first exemplary method 300a), then such ratios, APDF/APC, determined during series arcing would also be significantly greater than the corresponding ratios, APDF/APC, determined during startup of the inverter load. Moreover, if the processor 212 first calculated the APDF and APC at the end of each numbered time interval, and then determined the ratios, APDF/APC, for each numbered time interval, then such ratios, APDF/APC, determined during series arcing would likewise be significantly greater than the corresponding ratios, APDF/APC, determined during startup of the inverter load. Accordingly, based on the ratios, PDF/PC, illustrated in FIG. 6a, it can be concluded that analyzing at least the ratio, PDF/PC, at the end of each time interval, would be sufficient to discriminate between DC arcs and load-switching noise with increased reliability.

Figure 6B:
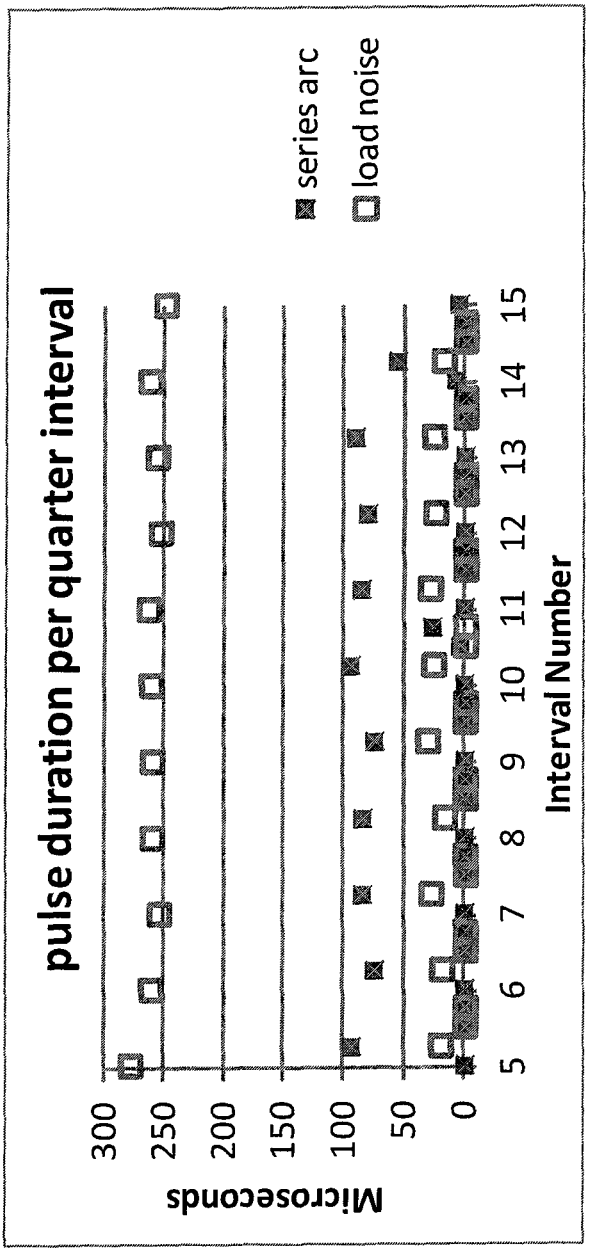

In this third example, it is further demonstrated that an analysis of at least the ratio, PDF/PDM, at the end of each time interval, would also be sufficient to reliably discriminate between DC arcs and very noisy loads, such as grid-tied inverter loads. FIG. 6b illustrates the PD per quarter time interval for the exemplary time intervals numbered 5 through 15, as measured by the processor 212. As shown in FIG. 6b, the majority of the PD for each time interval occurs within a fraction of the respective time interval. For example, for each of the numbered time intervals, most of the PD, ranging from about 250 μsecs to 300 μsecs, occurs within a fraction of the time interval near the start of the respective interval. Based on the measured PD per quarter time interval illustrated in FIG. 6b, it can be concluded that, in this third example, there can be significant pulse duration modulation (PDM) at about twice the grid frequency, e.g., 2×60 Hz or 120 Hz.

Figure 6C:
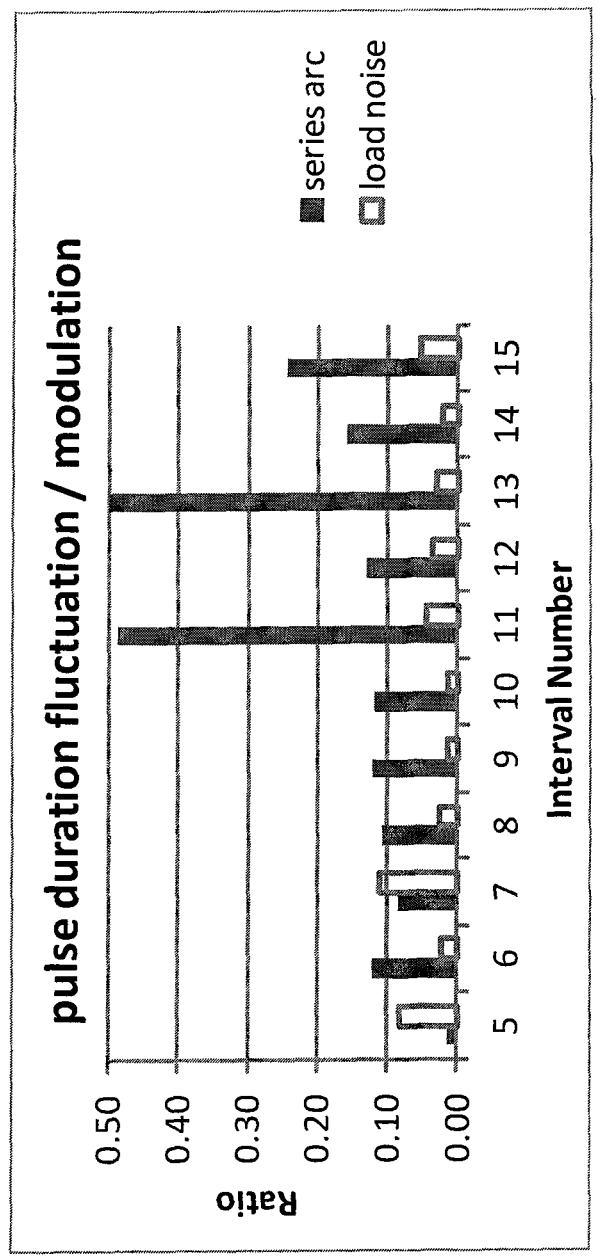

FIG. 6c illustrates the ratio, PDF/PDM, determined by the processor 212 for the exemplary time intervals numbered 5 through 15. Like the calculation of the APDM, as described herein with respect to the second exemplary method 300b, the PDM can be calculated by taking four PD measurements, PD1, PD2, PD3, PD4, during each numbered time interval, spaced one quarter of the time interval apart, and calculating the PDM at the end of each time interval as follows, $$PDM=|PD1+PD2-PD3-PD4|+|PD1-PD2-PD3+PD4|, \qquad (2)$$

or by any other suitable technique. As shown in FIG. 6c, the ratio, PDF/PDM, determined during series arcing is generally significantly greater than the corresponding ratio, PDF/PDM, determined during startup of the inverter load (see, e.g., the respective ratios, PDF/PDM, for time intervals 6, and 8 through 15). It is noted that, if the ratio, APDF/APDM, were determined at the end of each numbered time interval (as described herein with reference to step 318 of the second exemplary method 300b), then such ratios, APDF/APDM, determined during series arcing would also be significantly greater than the corresponding ratios, APDF/APDM, determined during startup of the inverter load. Moreover, if the processor 212 first calculated the APDF and APDM at the end of each numbered time interval, and then determined the ratios, APDF/APDM, for each numbered time interval, then such ratios, APDF/APDM, determined during series arcing would likewise be significantly greater than the corresponding ratios, APDF/APDM, determined during startup of the inverter load. Accordingly, based on the ratios, PDF/PDM, illustrated in FIG. 6c, it can be concluded that analyzing at least the ratio, PDF/PDM, at the end of each time interval, would be sufficient to discriminate between DC arcs and load-switching noise with increased reliability.

Having described the above exemplary embodiments of the disclosed systems and methods of detecting arcing in DC power systems, other alternative embodiments or variations may be made. For example, it was described herein, e.g., with reference to the third exemplary method 300c, that the processor 212 can determine, at the end of a plurality of predetermined time intervals, whether the ratio, APDF/APC, exceeds a first specified threshold value, C1, whether the ratio, APDF/APDM, exceeds a second specified threshold value, C2, whether the ratio, APCF/APC, exceeds a third specified threshold value C3, whether the ratio, APDF/APD, exceeds a fourth specified threshold value, C4, whether APC exceeds a fifth specified threshold value, C5, and/or whether APD exceeds a sixth specified threshold value, C6. In some embodiments, the detection of arcing in DC power systems can alternatively be based on determining, at the end of the respective time intervals, whether the ratio, PDF/PC, exceeds a first specified threshold value, C1, whether the ratio, PDF/PDM, exceeds a second specified threshold value, C2, whether the ratio, PCF/PC, exceeds a third specified threshold value C3, whether the ratio, PDF/PD, exceeds a fourth specified threshold value, C4, whether the PC exceeds a fifth specified threshold value, C5, and/or whether the PD exceeds a sixth specified threshold value, C6.

It was also described herein that the current sensor 202 can be implemented as a current transformer for monitoring the current output of a DC power system. In some embodiments, the current sensor 202 may be implemented using a DC current sensor, which can also serve as an AC-detecting current transformer with appropriate circuitry. It is noted that DC current data provided by the DC current sensor can augment the high frequency AC current information to improve arc fault detection relative to power system noise. Moreover, in some embodiments, the voltage output of a DC power system may be monitored instead of the current output for detecting arcing in the DC power system. Such embodiments may employ power system voltage data, as well as power system current data, to better discriminate between series arcing and parallel arcing. In addition, in some embodiments, the current sensor 202 may be replaced with an AC voltage sensor, which may be connected across the DC power lines. Such an AC voltage sensor can be implemented as a capacitor-coupled current transformer for providing electrical isolation between the DC power system and one or more AFDs.

It was also described herein that the PV system 100 can include a DC disconnect switch 112, which may be employed to extinguish arcing once such arcing has been detected. In some embodiments, in order to extinguish such arcing, PV systems may include a solid-state switch within one or more PV modules for disconnecting one or more PV panels, one or more contactors or circuit breakers within a combiner box for disconnecting one or more PV strings from a load, and/or one or more mechanisms for opening/shorting the load.

It was also described herein that the PV system 100 could include the combiner box 104. In some embodiments, such a PV system may be implemented without a combiner box, thereby allowing one or more PV strings to be directly connected to the load.

In addition, it is noted that the ratios employed in the exemplary methods 300*a*, 300*b*, 300*c* of detecting arcing in DC power systems generally do not require the use of complex division operations, but can be performed with conditional testing, e.g., after multiplying the specified thresholds by the denominators of the respective ratios. It is further noted that more complex tests may be defined by combining two or more of these ratios. For example, the two ratios, APDF/APC and APDF/APDM, may be combined to form a single ratio, APDF$^2$/APC/APDM. Likewise, the two ratios, PDF/PC and PDF/PDM, may be combined to form a single ratio, PDF$^2$/PC/PDM. Other suitable combinations of these ratios may also be employed to better discriminate between DC arcs and load-switching noise.

It is further noted that one or more embodiments described herein can include PV loads such as optimizers for adjusting DC-to-DC conversions so that each PV module or PV string operates at its maximum power point, microinverters for adjusting DC-to-AC conversions so that each PV module operates at its maximum power point, as well as DC-to-AC inverters connected to one or more PV strings. Embodiments described herein can also be combined with arc fault detectors (AFDs) attached to each PV module, and can be used in conjunction with ground fault detectors.

It will be apparent that one or more embodiments described herein may be implemented in many different forms of software and/or hardware. For example, one or more embodiments described herein may include suitable configurations of one or more computerized devices, hardware processors, and/or the like to carry out and/or support any or all of the systems and/or methods described herein. Further, one or more computerized devices, processors, digital signal processors, etc., may be programmed and/or configured to implement the systems and methods described herein.

It will be appreciated by those of ordinary skill in the art that further modifications to and variations of the above-described systems and methods of detecting arcing in DC power systems may be made without departing from the inventive concepts disclosed herein. Accordingly, the invention should not be viewed as limited except as by the scope and spirit of the appended claims.

What is claimed is:

1. A method of detecting arcing in a DC power system, the DC power system including a current output connected to a load, a current flowing in the DC power system at the current output, the method comprising:

providing an arc fault detector including a current sensor, a comparator, and a processor;

connecting the current sensor to the current output;

determining, by the current sensor, a current signal related to the current flowing in the DC power system;

in response to at least one change in the current signal over time (di/dt), generating, by the comparator, one or more pulses, the respective pulses having associated durations;

counting, by the processor, a number of pulses in at least one predetermined time interval to provide a pulse count for the predetermined time interval;

measuring, by the processor, a fluctuation in the durations of the respective pulses in the predetermined time interval;

calculating, by the processor, a first ratio of the fluctuation in the durations of the respective pulses to the pulse count;

determining, by the processor, a presence of arcing in the DC power system based at least in part on the first ratio; and having determined the presence of arcing in the DC power system, disconnecting, by a DC disconnect switch, the current output from the load in order to extinguish the arcing in the DC power system.

2. The method of claim 1 wherein the determining of the presence of arcing includes determining that the first ratio exceeds a first specified threshold value.

3. The method of claim 1 further comprising:

generating, by the processor, a plurality of outputs indicative of the presence of arcing in the DC power system for a plurality of predetermined time intervals, respectively;

calculating an average of the plurality of outputs; and determining the presence of arcing in the DC power system based on the average of the plurality of outputs.

4. The method of claim 1 wherein the counting of the number of pulses includes counting the number of pulses in each of a plurality of predetermined time intervals to provide pulse counts for the respective predetermined time intervals, and wherein the measuring of the fluctuation in the durations of the respective pulses includes measuring fluctuations in the durations of the respective pulses in the respective predetermined time intervals.

5. The method of claim 4 wherein the calculating of the first ratio includes calculating an average of the pulse counts after each predetermined time interval, calculating an average of the fluctuations in the durations of the respective pulses after each predetermined time interval, and calculating the first ratio based on the average of the fluctuations in the durations of the respective pulses and the average of the pulse counts.

6. The method of claim 1 further comprising:
measuring, by the processor, a modulation of the durations of the respective pulses in the predetermined time interval.

7. The method of claim 6 further comprising:
calculating, by the processor, a second ratio of the fluctuation in the durations of the respective pulses to the modulation of the durations of the respective pulses.

8. The method of claim 7 wherein the determining of the presence of arcing includes determining the presence of arcing in the DC power system based at least in part on the first ratio and the second ratio.

9. The method of claim 8 wherein the determining of the presence of arcing includes determining that the first ratio exceeds a first specified threshold value, and determining that the second ratio exceeds a second specified threshold value.

10. The method of claim 7 wherein the measuring of the fluctuation in the durations of the respective pulses includes measuring fluctuations in the durations of the respective pulses for a plurality of predetermined time intervals, and wherein the measuring of the modulation of the durations of the respective pulses includes measuring modulations of the durations of the respective pulses for the plurality of predetermined time intervals.

11. The method of claim 10 wherein the calculating of the second ratio includes calculating an average of the fluctuations in the durations of the respective pulses after each predetermined time interval, calculating an average of the modulations of the durations of the respective pulses after each predetermined time interval, and calculating the second ratio based on the average of the fluctuations in the durations of the respective pulses and the average of the modulations of the durations of the respective pulses.

12. The method of claim 7 further comprising:
measuring, by the processor, a fluctuation in the pulse count for the predetermined time interval.

13. The method of claim 12 further comprising:
calculating, by the processor, one or more of a third ratio of the fluctuation in the pulse count to the pulse count, and a fourth ratio of the fluctuation in the durations of the respective pulses to the durations of the respective pulses.

14. The method of claim 13 wherein the determining of the presence of arcing includes determining the presence of arcing in the DC power system based at least in part on the first ratio, and one or more of the second ratio, the third ratio, and the fourth ratio.

15. The method of claim 14 wherein the determining of the presence of arcing includes determining that the first ratio exceeds a first specified threshold value, determining that the second ratio exceeds a second specified threshold value, determining that the third ratio exceeds a third specified threshold value, and determining that the fourth ratio exceeds a fourth specified threshold value.

16. The method of claim 15 wherein the determining of the presence of arcing further includes determining that the pulse count exceeds a fifth specified threshold value, and determining that the durations of the respective pulses exceed a sixth specified threshold value.

17. The method of claim 16 wherein the measuring of the fluctuation in the pulse count includes measuring fluctuations in the pulse counts for a plurality of predetermined time intervals, and wherein the measuring of the fluctuation of the durations of the respective pulses includes measuring fluctuations of the durations of the respective pulses for the plurality of predetermined time intervals.

18. The method of claim 17 wherein the calculating of the third ratio includes calculating an average of the fluctuations in the pulse counts after each predetermined time interval, calculating an average of the pulse counts after each predetermined time interval, and calculating the third ratio based on the average of the fluctuations in the pulse counts and the average of the pulse counts.

19. The method of claim 17 wherein the calculating of the fourth ratio includes calculating an average of the fluctuations of the durations of the respective pulses after each predetermined time interval, calculating an average of the durations of the respective pulses after each predetermined time interval, and calculating the fourth ratio based on the average of the fluctuations of the durations of the respective pulses and the average of the durations of the respective pulses.

20. A system for detecting arcing in a DC power system, the DC power system including a current output connected to a load, a current flowing in the DC power system at the current output, the system comprising:
a current sensor connectable to the current output,
wherein the current sensor is operative to determine a current signal related to the current flowing in the DC power system;
a comparator operative, in response to at least one change in the current signal over time (di/dt), to generate one or more pulses, the respective pulses having associated durations;
a processor operative to execute at least one computer program out of at least one memory:
to count a number of pulses in at least one predetermined time interval to provide a pulse count for the predetermined time interval;
to measure a fluctuation in the durations of the respective pulses in the predetermined time interval;
to calculate a first ratio of the fluctuation in the durations of the respective pulses to the pulse count; and
to determine a presence of arcing in the DC power system based at least in part on the first ratio; and
a DC disconnect switch operative, having determined the presence of arcing in the DC power system, to disconnect the current output from the load in order to extinguish the arcing in the DC power system.

21. The system of claim 20 wherein the processor is further operative to execute the at least one computer program out of the at least one memory to generate a plurality of outputs indicative of the presence of arcing in the DC power system for a plurality of predetermined time intervals, respectively, to calculate an average of the plurality of outputs, and to determine the presence of arcing in the DC power system based on the average of the plurality of outputs.

22. A system for detecting arcing in a DC power system, the DC power system including a current output connected to a load, a current flowing in the DC power system at the current output, the system comprising:
  a current sensor connectable to the current output, wherein the current sensor is operative to determine a current signal related to the current flowing in the DC power system;
  a comparator operative, in response to at least one change in the current signal over time (di/dt), to generate one or more pulses, the respective pulses having associated durations;
  a processor operative to execute at least one computer program out of at least one memory:
    to count a number of pulses in at least one predetermined time interval to provide a pulse count for the predetermined time interval;
    to measure a fluctuation in the durations of the respective pulses in the predetermined time interval;
    to calculate a first ratio of the fluctuation in the durations of the respective pulses to the pulse count;
    to measure a modulation of the durations of the respective pulses in the predetermined time interval;
      to calculate a second ratio of the fluctuation in the durations of the respective pulses to the modulation of the durations of the respective pulses; and
      to determine a presence of arcing in the DC power system based at least in part on the first ratio and the second ratio; and
  a DC disconnect switch operative, having determined the presence of arcing in the DC power system, to disconnect the current output from the load in order to extinguish the arcing in the DC power system.

23. The system of claim 22 wherein the processor is further operative to execute the at least one computer program out of the at least one memory to generate a plurality of outputs indicative of the presence of arcing in the DC power system for a plurality of predetermined time intervals, respectively, to calculate an average of the plurality of outputs, and to determine the presence of arcing in the DC power system based on the average of the plurality of outputs.

* * * * *